(12) United States Patent
Nondhasitthichai et al.

(10) Patent No.: US 9,099,294 B1
(45) Date of Patent: Aug. 4, 2015

(54) MOLDED LEADFRAME SUBSTRATE SEMICONDUCTOR PACKAGE

(75) Inventors: Somchai Nondhasitthichai, Bangkok (TH); Saravuth Sirinorakul, Bangkok (TH)

(73) Assignee: UTAC Thai Limited, Bangkok (TH)

( * ) Notice: Subject to any disclaimer, the term of this patent is extended or adjusted under 35 U.S.C. 154(b) by 202 days.

(21) Appl. No.: 12/576,846

(22) Filed: Oct. 9, 2009

Related U.S. Application Data

(62) Division of application No. 12/002,186, filed on Dec. 14, 2007.

(60) Provisional application No. 60/875,162, filed on Dec. 14, 2006, provisional application No. 60/877,274, filed on Dec. 26, 2006.

(51) Int. Cl.
*H01L 23/495* (2006.01)
*H01L 23/00* (2006.01)

(52) U.S. Cl.
CPC ......... *H01L 24/00* (2013.01); *H01L 2924/1511* (2013.01)

(58) Field of Classification Search
USPC .......................................... 257/666; 438/123
See application file for complete search history.

(56) References Cited

U.S. PATENT DOCUMENTS

| | | | |
|---|---|---|---|
| 3,611,061 A | 10/1971 | Segerson | 317/234 R |
| 4,411,719 A | 10/1983 | Lindberg | 156/64 |
| 4,501,960 A | 2/1985 | Jouvet et al. | 235/492 |
| 4,801,561 A | 1/1989 | Sankhagowit | 437/207 |
| 4,855,672 A | 8/1989 | Shreeve | 324/158 R |
| 5,105,259 A | 4/1992 | McShane et al. | |
| 5,195,023 A | 3/1993 | Manzione et al. | |
| 5,247,248 A | 9/1993 | Fukunaga | 324/158 |
| 5,248,075 A | 9/1993 | Young et al. | 228/5.1 |
| 5,281,851 A | 1/1994 | Mills et al. | |
| 5,285,104 A | 2/1994 | Kondo et al. | |
| 5,343,076 A * | 8/1994 | Katayama et al. | 257/717 |
| 5,396,185 A | 3/1995 | Honma et al. | 324/754 |
| 5,397,921 A | 3/1995 | Karnezos | |
| 5,479,105 A | 12/1995 | Kim et al. | 324/755 |
| 5,535,101 A | 7/1996 | Miles et al. | |
| 5,596,231 A | 1/1997 | Combs | |
| 5,767,527 A | 6/1998 | Yoneda et al. | |

(Continued)

OTHER PUBLICATIONS

Office Action dated Feb. 10, 2011, U.S. Appl. No. 12/002,187, filed Dec. 14, 2007, Somchai Nondhasitthichai et al.

(Continued)

*Primary Examiner* — Mark Tornow
(74) *Attorney, Agent, or Firm* — Haverstock & Owens LLP

(57) ABSTRACT

A process for forming an optical package comprises at least partially encasing a first leadframe strip in a first mold compound thereby forming a molded leadframe strip, mounting at least one optical semiconductor device on the molded leadframe strip, at least partially encasing the molded leadframe strip, and singulating the molded leadframe strip to form discrete packages for optical applications. An apparatus for forming an optical package comprises means for at least partially encasing a first leadframe strip in a first mold compound thereby forming a molded leadframe strip, means for mounting at least one optical semiconductor device on the at least one molded leadframe strip, means for at least partially encasing the molded leadframe strip, and means for singulating the molded leadframe strip to form discrete and grid array packages.

18 Claims, 12 Drawing Sheets

(56) References Cited

U.S. PATENT DOCUMENTS

| | | | |
|---|---|---|---|
| 5,843,808 A | 12/1998 | Karnezos | |
| 5,990,692 A | 11/1999 | Jeong et al. | 324/755 |
| 6,033,933 A | 3/2000 | Hur | |
| 6,072,239 A | 6/2000 | Yoneda et al. | 257/730 |
| 6,111,324 A | 8/2000 | Sheppard et al. | |
| 6,159,770 A | 12/2000 | Tetaka et al. | 438/112 |
| 6,177,729 B1 | 1/2001 | Benenati et al. | |
| 6,197,615 B1 | 3/2001 | Song et al. | |
| 6,208,020 B1 | 3/2001 | Minamio et al. | |
| 6,229,200 B1 | 5/2001 | Mclellan et al. | |
| 6,242,281 B1 | 6/2001 | Mclellan et al. | |
| 6,250,841 B1 | 6/2001 | Ledingham | |
| 6,284,569 B1 | 9/2001 | Sheppard et al. | |
| 6,285,075 B1 | 9/2001 | Combs et al. | |
| 6,291,263 B1 * | 9/2001 | Huang | 438/106 |
| 6,294,100 B1 | 9/2001 | Fan et al. | |
| 6,304,000 B1 | 10/2001 | Isshiki et al. | 257/782 |
| 6,326,678 B1 | 12/2001 | Karnezos et al. | |
| 6,329,711 B1 | 12/2001 | Kawahara et al. | 257/698 |
| 6,353,263 B1 | 3/2002 | Dotta et al. | 257/777 |
| 6,372,625 B1 | 4/2002 | Shigeno et al. | |
| 6,376,921 B1 | 4/2002 | Yoneda et al. | 257/787 |
| 6,384,472 B1 * | 5/2002 | Huang | 257/680 |
| 6,392,427 B1 | 5/2002 | Yang | 324/755 |
| 6,414,385 B1 | 7/2002 | Huang et al. | 257/690 |
| 6,429,048 B1 | 8/2002 | McLellan et al. | |
| 6,451,709 B1 | 9/2002 | Hembree | 438/759 |
| 6,455,348 B1 | 9/2002 | Yamaguchi | 438/106 |
| 6,476,469 B2 * | 11/2002 | Hung et al. | 257/676 |
| 6,489,218 B1 | 12/2002 | Kim et al. | |
| 6,498,099 B1 | 12/2002 | McLellan et al. | |
| 6,507,116 B1 | 1/2003 | Caletka et al. | |
| 6,545,332 B2 * | 4/2003 | Huang | 257/433 |
| 6,545,347 B2 | 4/2003 | McClellan | |
| 6,552,417 B2 | 4/2003 | Combs | |
| 6,552,423 B2 | 4/2003 | Song et al. | |
| 6,566,740 B2 | 5/2003 | Yasunaga et al. | 257/670 |
| 6,573,121 B2 | 6/2003 | Yoneda et al. | 438/106 |
| 6,585,905 B1 | 7/2003 | Fan et al. | |
| 6,586,834 B1 | 7/2003 | Sze et al. | |
| 6,635,957 B2 | 10/2003 | Kwan et al. | |
| 6,667,191 B1 | 12/2003 | McLellan et al. | |
| 6,683,368 B1 | 1/2004 | Mostafazadeh | |
| 6,686,667 B2 * | 2/2004 | Chen et al. | 257/787 |
| 6,703,696 B2 | 3/2004 | Ikenaga et al. | 257/678 |
| 6,723,585 B1 | 4/2004 | Tu et al. | |
| 6,724,071 B2 | 4/2004 | Combs | |
| 6,730,544 B1 * | 5/2004 | Yang | 438/110 |
| 6,734,044 B1 | 5/2004 | Lin et al. | |
| 6,734,552 B2 | 5/2004 | Combs et al. | |
| 6,737,720 B2 * | 5/2004 | Ho et al. | 257/433 |
| 6,737,755 B1 | 5/2004 | McLellan et al. | |
| 6,764,880 B2 | 7/2004 | Wu et al. | 438/123 |
| 6,781,242 B1 | 8/2004 | Fan et al. | |
| 6,800,948 B1 | 10/2004 | Fan et al. | |
| 6,812,552 B2 | 11/2004 | Islam et al. | |
| 6,818,472 B1 | 11/2004 | Fan et al. | |
| 6,818,978 B1 | 11/2004 | Fan | |
| 6,818,980 B1 | 11/2004 | Pedron, Jr. | |
| 6,841,859 B1 | 1/2005 | Thamby et al. | |
| 6,876,066 B2 | 4/2005 | Fee et al. | 257/666 |
| 6,893,169 B1 * | 5/2005 | Exposito et al. | 385/92 |
| 6,894,376 B1 | 5/2005 | Mostafazadeh et al. | |
| 6,897,428 B2 | 5/2005 | Minamio et al. | |
| 6,927,483 B1 | 8/2005 | Lee et al. | |
| 6,933,176 B1 | 8/2005 | Kirloskar et al. | |
| 6,933,594 B2 | 8/2005 | McLellan et al. | |
| 6,940,154 B2 | 9/2005 | Pedron et al. | 257/666 |
| 6,946,324 B1 | 9/2005 | McLellan et al. | |
| 6,964,918 B1 | 11/2005 | Fan et al. | |
| 6,967,126 B2 | 11/2005 | Lee et al. | 438/122 |
| 6,979,594 B1 | 12/2005 | Fan et al. | |
| 6,982,491 B1 | 1/2006 | Fan et al. | |
| 6,984,785 B1 | 1/2006 | Diao et al. | |
| 6,989,294 B1 | 1/2006 | McLellan et al. | |
| 6,995,460 B1 | 2/2006 | McLellan et al. | |
| 7,008,825 B1 | 3/2006 | Bancod et al. | 438/123 |
| 7,009,286 B1 | 3/2006 | Kirloskar et al. | |
| 7,045,883 B1 | 5/2006 | McCann et al. | |
| 7,049,177 B1 | 5/2006 | Fan et al. | |
| 7,049,684 B2 * | 5/2006 | Minamio et al. | 257/666 |
| 7,052,935 B2 | 5/2006 | Pai et al. | |
| 7,060,535 B1 | 6/2006 | Sirinorakul et al. | |
| 7,071,545 B1 | 7/2006 | Patel et al. | |
| 7,091,581 B1 | 8/2006 | McLellan et al. | |
| 7,101,210 B2 | 9/2006 | Lin et al. | 439/331 |
| 7,102,210 B2 | 9/2006 | Ichikawa | 257/666 |
| 7,125,747 B2 | 10/2006 | Lee et al. | |
| 7,205,178 B2 | 4/2007 | Shiu et al. | 438/110 |
| 7,224,048 B1 | 5/2007 | McLellan et al. | |
| 7,247,526 B1 | 7/2007 | Fan et al. | 438/123 |
| 7,253,503 B1 | 8/2007 | Fusaro et al. | |
| 7,259,678 B2 | 8/2007 | Brown et al. | |
| 7,274,088 B2 | 9/2007 | Wu et al. | |
| 7,314,820 B2 | 1/2008 | Lin et al. | 438/617 |
| 7,315,077 B2 | 1/2008 | Choi et al. | |
| 7,315,080 B1 | 1/2008 | Fan et al. | |
| 7,342,305 B1 | 3/2008 | Diao et al. | |
| 7,344,920 B1 | 3/2008 | Kirloskar et al. | |
| 7,348,663 B1 * | 3/2008 | Kirloskar et al. | 257/704 |
| 7,358,119 B2 | 4/2008 | McLellan et al. | |
| 7,371,610 B1 | 5/2008 | Fan et al. | |
| 7,372,151 B1 | 5/2008 | Fan et al. | |
| 7,381,588 B1 | 6/2008 | Patel et al. | |
| 7,399,658 B2 | 7/2008 | Shim et al. | |
| 7,408,251 B2 | 8/2008 | Hata et al. | 257/678 |
| 7,411,289 B1 | 8/2008 | McLellan et al. | |
| 7,449,771 B1 | 11/2008 | Fan et al. | |
| 7,459,345 B2 | 12/2008 | Hwan | |
| 7,482,690 B1 | 1/2009 | Fan et al. | |
| 7,495,319 B2 | 2/2009 | Fukuda et al. | |
| 7,507,603 B1 * | 3/2009 | Berry et al. | 438/113 |
| 7,553,688 B2 * | 6/2009 | Bolken et al. | 438/64 |
| 7,595,225 B1 | 9/2009 | Fan et al. | |
| 7,608,484 B2 | 10/2009 | Lange et al. | |
| 7,691,678 B2 * | 4/2010 | Shimizu et al. | 438/114 |
| 7,709,857 B2 | 5/2010 | Kim et al. | |
| 7,714,418 B2 | 5/2010 | Lim et al. | |
| 8,035,207 B2 | 10/2011 | Camacho et al. | |
| 2001/0007285 A1 | 7/2001 | Yamada et al. | |
| 2002/0109214 A1 | 8/2002 | Minamio et al. | |
| 2003/0006055 A1 | 1/2003 | Chien-Hung et al. | |
| 2003/0045012 A1 | 3/2003 | Abe | |
| 2003/0071333 A1 | 4/2003 | Matsuzawa | |
| 2003/0143776 A1 | 7/2003 | Pedron, Jr. et al. | |
| 2003/0178719 A1 | 9/2003 | Combs et al. | |
| 2003/0201520 A1 | 10/2003 | Knapp et al. | 257/666 |
| 2003/0207498 A1 | 11/2003 | Islam et al. | 438/120 |
| 2003/0234454 A1 | 12/2003 | Pedron et al. | |
| 2004/0014257 A1 * | 1/2004 | Kim et al. | 438/111 |
| 2004/0026773 A1 | 2/2004 | Koon et al. | |
| 2004/0046237 A1 | 3/2004 | Abe et al. | |
| 2004/0046241 A1 | 3/2004 | Combs et al. | |
| 2004/0070055 A1 | 4/2004 | Punzalan et al. | |
| 2004/0080025 A1 | 4/2004 | Kasahara et al. | |
| 2004/0110319 A1 | 6/2004 | Fukutomi et al. | 438/106 |
| 2005/0003586 A1 | 1/2005 | Shimanuki et al. | |
| 2005/0077613 A1 | 4/2005 | McLellan et al. | |
| 2005/0236701 A1 | 10/2005 | Minamio et al. | |
| 2005/0263864 A1 | 12/2005 | Islam et al. | |
| 2006/0071351 A1 | 4/2006 | Lange | |
| 2006/0170081 A1 | 8/2006 | Gerber et al. | |
| 2006/0192295 A1 | 8/2006 | Lee et al. | |
| 2006/0223229 A1 | 10/2006 | Kirloskar et al. | |
| 2006/0223237 A1 | 10/2006 | Combs et al. | |
| 2006/0273433 A1 | 12/2006 | Itou et al. | |
| 2007/0001278 A1 | 1/2007 | Jeon et al. | |
| 2007/0013038 A1 | 1/2007 | Yang | |
| 2007/0029540 A1 | 2/2007 | Kajiwara et al. | |
| 2007/0093000 A1 * | 4/2007 | Shim et al. | 438/123 |
| 2007/0181997 A1 * | 8/2007 | Ahr et al. | 257/712 |
| 2007/0200210 A1 | 8/2007 | Zhao et al. | 257/676 |
| 2007/0235217 A1 | 10/2007 | Workman | |
| 2008/0048308 A1 * | 2/2008 | Lam | 257/686 |

(56) References Cited

U.S. PATENT DOCUMENTS

| | | | |
|---|---|---|---|
| 2008/0150094 | A1 | 6/2008 | Anderson ................. 257/659 |
| 2009/0152691 | A1 | 6/2009 | Nguyen et al. |
| 2009/0152694 | A1 | 6/2009 | Bemmerl et al. |
| 2009/0230525 | A1 | 9/2009 | Chang Chien et al. |
| 2009/0236713 | A1 | 9/2009 | Xu et al. |
| 2010/0133565 | A1 | 6/2010 | Cho et al. |
| 2010/0149773 | A1 | 6/2010 | Said |
| 2010/0178734 | A1 | 7/2010 | Lin |
| 2010/0224971 | A1 | 9/2010 | Li |
| 2011/0076805 | A1 | 3/2011 | Nondhasitthichai et al. |
| 2011/0115061 | A1 | 5/2011 | Krishnan et al. |
| 2011/0201159 | A1 | 8/2011 | Mori et al. |

OTHER PUBLICATIONS

Michael Quirk and Julian Serda, Semiconductor Manufacturing Technology, Pearson Education International, Pearson Prentice Hall, 2001, p. 587-588.
Office Action dated May 9, 2011, U.S. Appl. No. 12/231,710, filed Sep. 4, 2008, Saravuth Sirinorakul et al.
Office Action dated Jan. 28, 2010, U.S. Appl. No. 12/378,119, filed Feb. 10, 2009, Somchai Nondhasitthichai et al.
Office Action dated Sep. 23, 2010, U.S. Appl. No. 12/002,186, filed Dec. 14, 2007, Somchai Nondhasitthichai et al.
Office Action dated Oct. 29, 2010, U.S. Appl. No. 12/378,119, filed Feb. 2, 2009, Somchai Nondhasitthichai et al.
Office Action dated Aug. 3, 2011, U.S. Appl. No. 12/002,187, filed Dec. 14, 2007, Somchai Nondhasitthichai et al.
Office Action dated May 11, 2010, U.S. Appl. No. 12/002,054, filed Dec. 14, 2007, Somchai Nondhasitthichai et al.
Office Action dated Apr. 25, 2012, U.S. Appl. No. 12/960,268, filed Dec. 3, 2010, Somchai Nondhasitthichai et al.
Non-Final Office Action mailed Dec. 20, 2012, U.S. Appl. No. 13/045,253, filed Mar. 10, 2011, Saravuth Sirinorakul.
Notice of Allowance, dated Nov. 28, 2012, U.S. Appl. No. 12/960,268, filed Dec. 3, 2012, Saravuth Sirinorakul et al.
Office Action mailed Dec. 19, 2012, U.S. Appl. No. 12/834,688, filed Jul. 12, 2010, Saravuth Sirinorakul.
Office Action mailed on Dec. 27, 2013, U.S. Appl. No. 12/002,186, filed Dec. 14, 2007, Somchai Nondhasitthichai et al.
Office Action mailed on Jan. 28, 2014, U.S. Appl. No. 12/002,054, filed Dec. 14, 2007, Somchai Nondhasitthichai et al.
Office Action mailed on Jan. 15, 2014, U.S. Appl. No. 12/002,187, filed Dec. 14, 2007, Somchai Nondhasitthichai et al.
Office Action mailed on Dec. 31, 2013, U.S. Appl. No. 12/378,119, filed Feb. 10, 2009, Somchai Nondhasitthichai et al.
Non-Final Office Action mailed Dec. 30, 2014, U.S. Appl. No. 13/886,888, filed May 3, 2013, Somchai Nondhasitthichai.

* cited by examiner

MOLDED LEADFRAME SUBSTRATE SEMICONDUCTOR PACKAGE

RELATED APPLICATIONS

This application is a Divisional Application of the co-pending application Ser. No. 12/002,186 filed Dec. 14, 2007 and titled MOLDED LEADFRAME SUBSTRATE SEMICONDUCTOR PACKAGE," hereby incorporated in its entirety.

RELATED APPLICATIONS

This application claims benefit of priority under 35 U.S.C. section 119(e) of U.S. Provisional Patent Application 60/875,162 filed Dec. 14, 2006, entitled MOLDED-LEADFRAME SUBSTRATE SEMICONDUCTOR PACKAGE and U.S. Provisional Patent Application 60/877,274 filed Dec. 26, 2006, entitled MOLDED-LEADFRAME SUBSTRATE SEMICONDUCTOR PACKAGE, which are both incorporated herein by reference.

FIELD OF THE INVENTION

The present invention is in the field of semiconductor packaging and is more specifically directed to package with heat transfer.

BACKGROUND

Optical semiconductor devices are found in many common appliances, such as digital cameras, digital camcorders, laptop computers, cellular phones, and many other devices. Generally, optical devices comprise charge coupled devices along with an image or video processor to compress and transmit data.

FIG. 1 shows optical semiconductor device 10 in current practice. The device 10 is a leadframe based device wherein an optical die 11 is mounted on a leadframe 12. The leadframe 12 is partially encased in a mold compound 13 leaving an opening 14 for the optical die 11. Optionally, a light permeable covering (not shown) is placed over the optical die 11 for protection. Although such devices 10 offer a high degree of reliability, they are generally limited to a low input output (I/O) count. As devices with optical die 11 increase in complexity and consumers demand items such as cameras having more image capturing capability, die sizes and I/O counts increase. In such applications with dozens or hundreds of I/O, such devices 10 are not an option. In one current example, every prominent manufacturer of high definition televisions offers a rear projection display option. This is commonly marketed by Sony as SXRD and Samsung as DLP, licensed from Texas Instruments. The complexity of such an optical application requires dozens to hundreds of I/O.

To overcome the issues mentioned above, the semiconductor industry has moved toward Ball Grid Array (BGA) packages. The BGA is descended from the pin grid array (PGA), which is a package with one face covered (or partly covered) with pins in a grid pattern. These pins are used to conduct electrical signals from the integrated circuit (IC) to the printed circuit board (PCB) it is placed on. In a BGA, the pins are replaced by balls of solder stuck to the bottom of the package. The device is placed on a PCB having copper pads in a pattern that matches the solder balls. The assembly is then heated, either in a reflow oven or by an infrared heater, causing the solder balls to melt. Surface tension causes the molten solder to hold the package in alignment with the circuit board, at the correct separation distance, while the solder cools and solidifies. The BGA is a solution to the problem of producing a miniature package for an IC with many hundreds of I/O. As pin grid arrays and dual-in-line (DIP) surface mount (SOIC) packages are produced with more and more pins, and with decreasing spacing between the pins, difficulties arose in the soldering process. As package pins got closer together, the danger of accidentally bridging adjacent pins with solder grew. BGAs do not have this problem, because the solder is factory-applied to the package in exactly the right amount. Alternatively, solder balls are able to be replaced by solder landing pads, forming a Land Grid Array (LGA) package.

FIG. 2 shows a cutaway image of a generic BGA package 20. Generally, an IC 21 has bondpads 22 to which bondwires 23 are affixed. The IC 21 is mounted on a substrate 24. In current practice, the substrate 24 is a laminate, such as polyimide. Generally, the substrate 24 is of a similar construction to a PCB. The substrate 24 has copper patterns 25 formed thereon. The bondwires 23 effectuate electrical contact between the IC 21 and the copper patterns 25. The copper patterns 25 are electrically connected to solder balls 26 through via holes 27 in the substrate 24. In most embodiments of BGA packages, the IC 21 is encapsulated by a mold compound 28. In optical applications, an opening 29 is formed over the IC 21. Optionally, a light permeable covering, such as glass, is mounted in the opening 29 to protect the die 21. Although BGA packages effectuate large I/O count devices in small areas, they are susceptible to moisture. Generally, moisture seeps into packages while awaiting assembly into a finished product, such as a computer. When the package is quickly heated to solder the device into its end application, moisture trapped within the device turns into vapor and cannot escape quickly enough, causing the package to burst open. This phenomenon is known as the "popcorn" effect. What is needed is a semiconductor package that is robust to both structural stressors and moisture.

SUMMARY OF THE DISCLOSURE

A process for forming a semiconductor package for optical applications comprises at least partially encasing a first leadframe strip in a first mold compound thereby forming a molded leadframe strip, mounting at least one optical semiconductor device on the molded leadframe strip, mounting bondwires on the at least one semiconductor die to effectuate electrical contact between the at least one semiconductor die and the at least one molded leadframe, mounting at least one cap on the molded leadframe strip, at least partially encasing the molded leadframe strip, the at least one semiconductor device, at least one cap, and bondwires and singulating the molded leadframe strip to form discrete packages for optical applications. The cap is configured to allow light to permeate to the optical semiconductor device. The cap comprises at least one of the following materials: glass, silicon, ceramic, metal, epoxy, and plastic. In some embodiments, the process further comprises embossing at least one step cavity into the molded leadframe strip for encapsulating the at least one semiconductor device. Optionally, the process further comprises coupling the first leadframe strip to a second leadframe strip, thereby forming a dual leadframe strip. The first leadframe strip and the second leadframe strip are coupled by a soft metal which comprises at least one of the following materials: gold, silver, lead, and tin. The first and second mold compounds are able to be identical or differing compounds.

An apparatus for forming an semiconductor package for optical applications comprises means for at least partially encasing a first leadframe strip in a first mold compound thereby forming a molded leadframe strip, means for mounting at least one optical semiconductor device on the at least one molded leadframe strip, means for mounting bondwires on the at least one semiconductor die to effectuate electrical contact between the at least one semiconductor die and the molded leadframe, means for mounting a cap thereby forming a full cavity into the molded leadframe strip for encapsulating the at least one semiconductor device, means for at least partially encasing the molded leadframe strip, the at least one semiconductor device, cap, and bondwires in a second mold compound, and means for singulating the molded leadframe strip to form discrete and grid array packages. The cap is configured to allow light to permeate to the optical semiconductor device. The cap comprises at least one of the following materials: glass, silicon, ceramic, metal, epoxy, and plastic. In some embodiments, the apparatus further comprises an embossing surface for forming a step cavity into the molded leadframe strip for encapsulating the at least one semiconductor device. Optionally, the apparatus further comprises means for coupling the first leadframe to a second leadframe by a soft metal. The soft metal comprises at least one of the following materials: gold, silver, lead, and tin. The first and second mold compounds are able to be identical or differing compounds.

A semiconductor package for optical applications comprises a first leadframe, a substrate for supporting the leadframe, at least one semiconductor die mounted on the leadframe, a plurality of bondwires to effectuate electrical contact between the leadframe and the at least one semiconductor die, a cap mounted on the leadframe configured for allowing light to permeate to the at least one semiconductor die and a second mold compound for at least partially encasing the leadframe, the substrate, the at least one semiconductor device and the plurality of wirebonds. In some embodiments, the substrate comprises a first mold compound. Optionally, the first leadframe is coupled to a second leadframe by a soft metal. The soft metal is comprised of at least one of the following materials: gold, silver, lead and tin.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following description, numerous details and alternatives are set forth for purpose of explanation. However, one of ordinary skill in the art will realize that the invention can be practiced without the use of these specific details. In other instances, well-known structures and devices are shown in block diagram form in order not to obscure the description of the invention with unnecessary detail. For example, it is commonly known in the art of semiconductor device assembly that assembly is generally done on a matrix array of leadframes, often referred to as leadframe strips, each strip having a plurality of individual positions that will be processed in various ways to form individual packaged semiconductor devices. A position can have one or more semiconductor die within. One of ordinary skill in the art will readily ascertain whether a single leadframe or a matrix of leadframes is being referred to depending on the reference.

Figure 1:
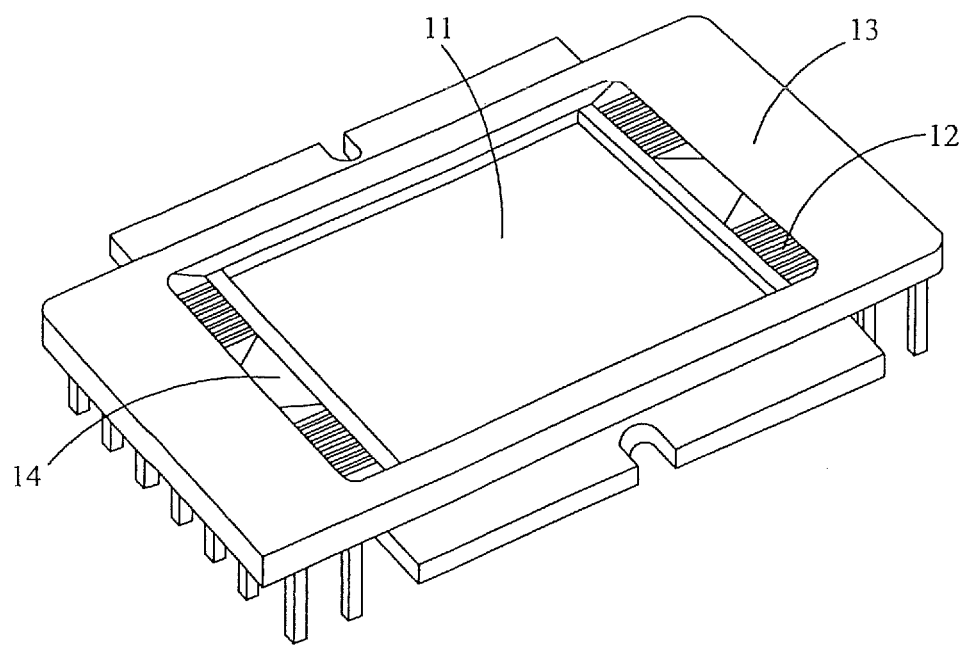
FIG. 1 is a prior art optical semiconductor package.
Figure 2:
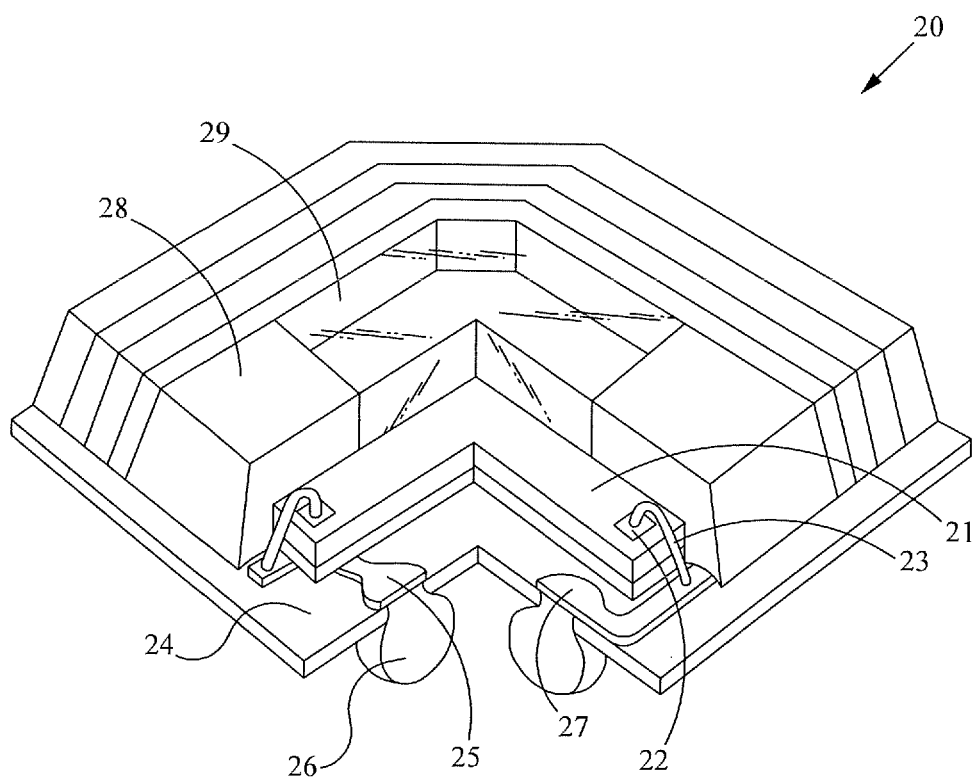
FIG. 2 is a prior art optical Ball Grid Array package in cross section.
Figure 3:
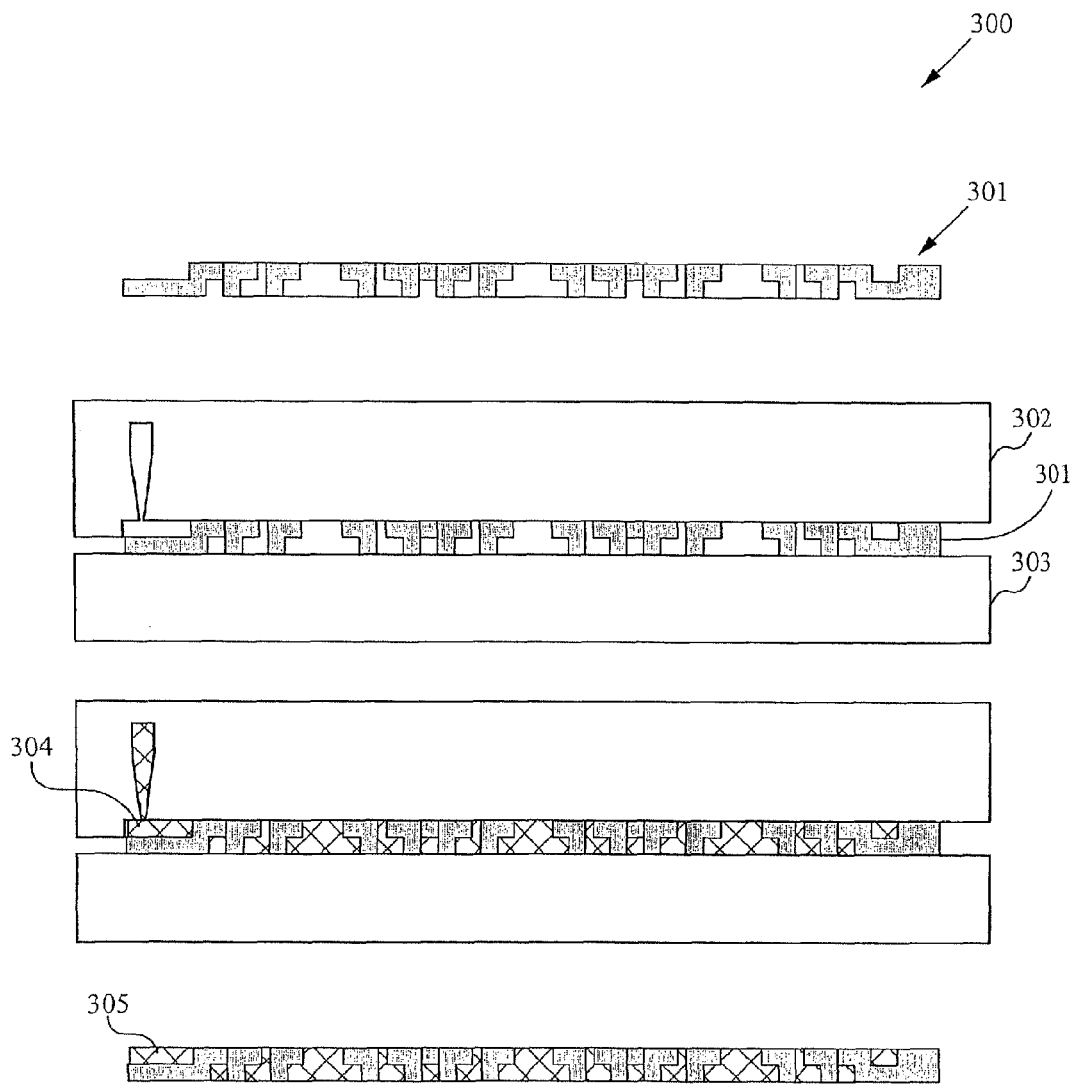
FIG. 3 is a process for forming a molded leadframe per an embodiment of the current invention.

A process 300 for forming semiconductor packages is detailed in FIG. 3. A leadframe strip 301 is shown in cross section. In some embodiments, a top mold 302 and a bottom mold 303 are placed to effectuate the injection therein of a mold compound 304. The top and bottom molds 302, 303 are able to be metal, ceramic, or any material having an appropriate thermal characteristic to withstand the temperatures of the mold compound 304 in its liquid state. It is commonly known by those of ordinary skill in the art of semiconductor device manufacturing that a wide variety of mold compounds 304 can be used, each having advantages, disadvantages, and characteristics appropriate for a given application. By way of example, in high temperature applications such as microprocessors which generate a significant amount of heat, a high thermal conductivity mold compound 304 can be used. What is formed is a molded lead frame 305. Advantageously, the molded leadframe strip 305 will display enhanced rigidity and robust reliability characteristics. The use of a mold compound 304 further enhances encapsulation and protection from external moisture that standard PCB substrates such as polyimide or FR4 cannot provide.

Figure 4A:
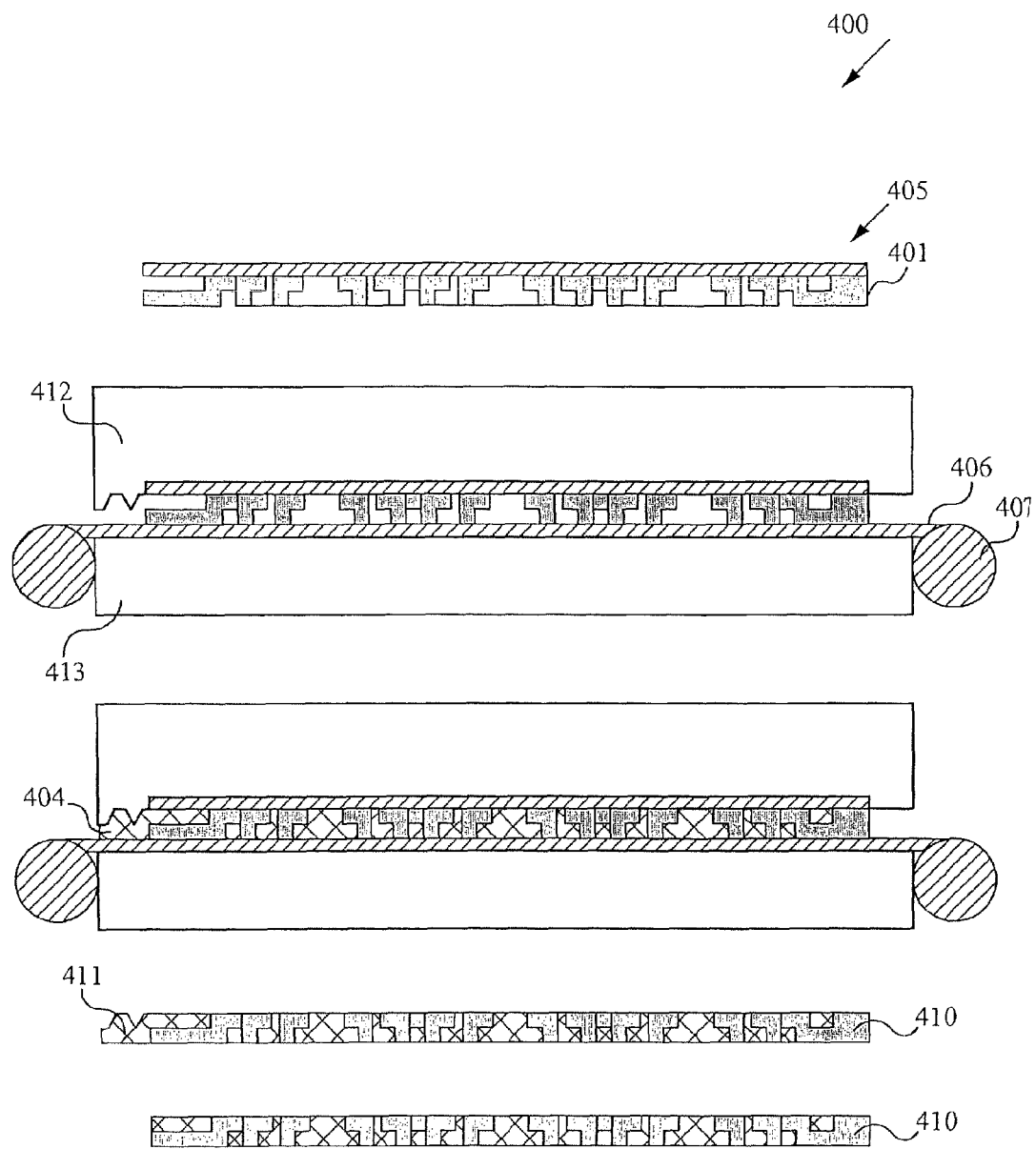
FIG. 4A is a process for forming a molded leadframe per an embodiment of the current invention.

For more predictable molding results, carrier tape is able to be used effectuate the molding process. FIG. 4A details another embodiment of the invention. A process 400 includes applying tape 405 on its adhesive side to a leadframe strip 401. The leadframe strip 401 is then placed in a top mold 412 by the top surface of the leadframe 401. On the opposite side of the leadframe strip 401, non-adhesive tape 406 is prepared in a tape loader 407 at the bottom mold 413. Once the leadframe strip 401 is in place between the top mold 412 and the bottom bold 413, mold compound 404 is injected and fills all empty cavities. When removed from the mold, a molded leadframe strip 410 is formed. Optionally, a de-gate/de-runner step removes excess mold compound 411.

Figure 4B:
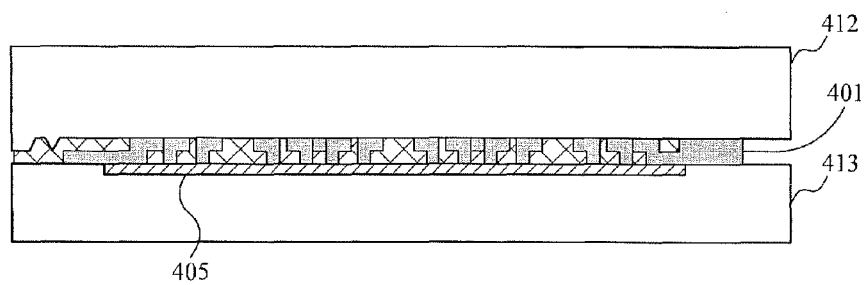
FIG. 4B is a process for forming a molded leadframe per an embodiment of the current invention.
Figure 4C:
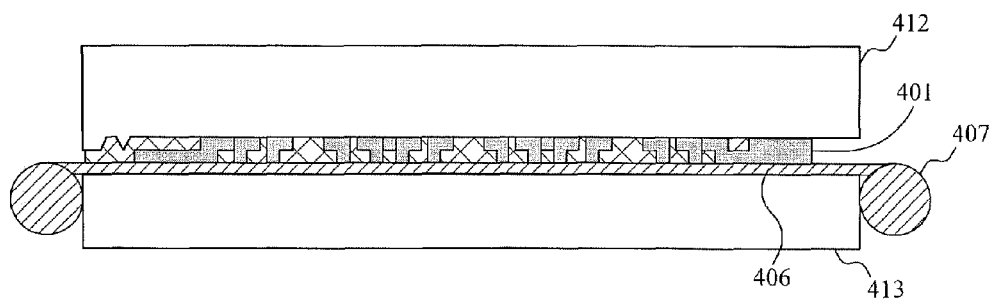
FIG. 4C illustrates two exemplary processes for forming a molded leadframe of the current invention.
Figure 4C:
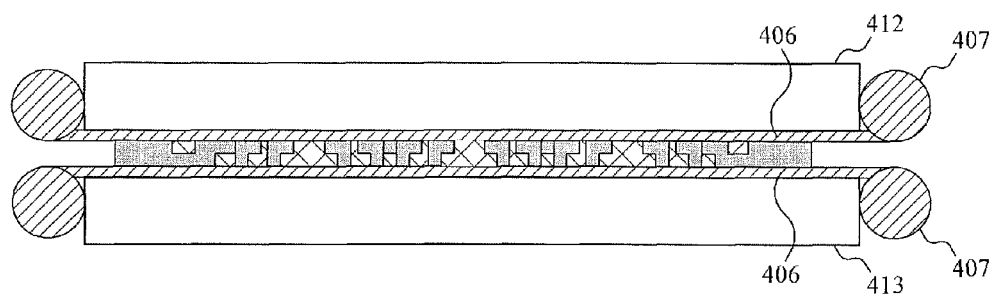

FIG. 4B shows alternate embodiments for the process detailed in FIG. 4A. In some embodiments, the leadframe strip 401 is able to be placed between the top mold 412 and bottom mold 413 with adhesive tape 405 applied to the bottom. FIG. 4C shows embodiments wherein the leadframe strip 401 is able to be placed between the top mold 412 and bottom mold 413 without the use of adhesive tape. In an exemplary embodiment, non adhesive tape 406 is able to be provided by a tape loader 407 on the bottom surface of the leadframe strip 401. In another exemplary embodiment, two tape loaders 407 are provided to effectuate the molding of the leadframe strip 401. It will be appreciated by those of ordinary skill in the art of semiconductor manufacturing that several embodiments exist to place a leadframe strip 401 between a top mold 412 and a bottom mold 413 and the embodiments discussed herein are written solely to be exemplary and non limiting.

Figure 5:
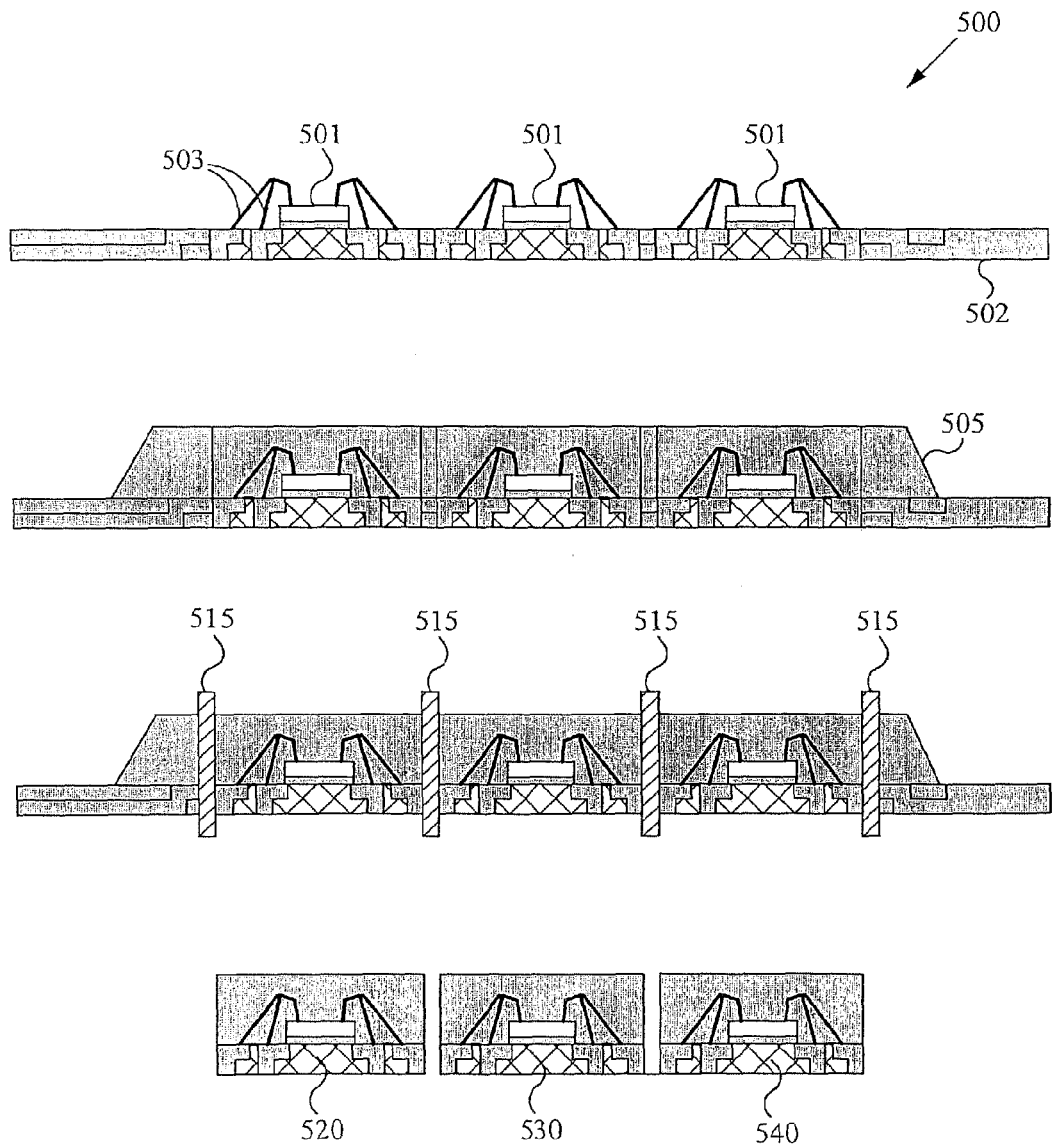
FIG. 5 is a process for forming individual packages per an embodiment of the current invention.

FIG. 5 shows a process 500 for the completion of the semiconductor packaging process. Semiconductor devices 501 are mounted on the molded leadframe strip 502. In some embodiments, multiple semiconductor devices 501 are mounted in each individual position on the molded leadframe strip 502. Such devices are known as multi chip modules (MCM). Bondwires 503 are mounted on the semiconductor devices 501 to effectuate electrical contact between the molded leadframe strip 502 and the semiconductor devices 501. In some embodiments where multiple semiconductor devices 501 are placed in each position, bondwires 503 can be placed to effectuate electrical contact between them as applications require. Next, a second mold compound 505 is applied to the molded leadframe strip 502. The second mold 505 encases the semiconductor devices 501 and bondwires 503 to protect them from harsh outer environments. In some embodiments, the second mold compound 505 and the first mold compound described in FIGS. 3 and 4 are the same. Alternatively, the first and second mold compound 505 are able to be different to meet the demands of particular applications. By way of example, the semiconductor device 501 and the leadframe 401 in FIG. 4 can have different coefficients of expansion in response to heat, and different mold compounds having different thermal characteristics such as thermal resistivity and thermal expansion are able to offset such effects. The molded leadframe strip 502 are then singulated by saw blades 515 to form singulated semiconductor packages 520, 530 and 540. The singulated devices 520 530 and 540 are generally tested, subjected to stress, and tested again to ensure reliability and to filter out non passing or non standard units.

Figure 6A:
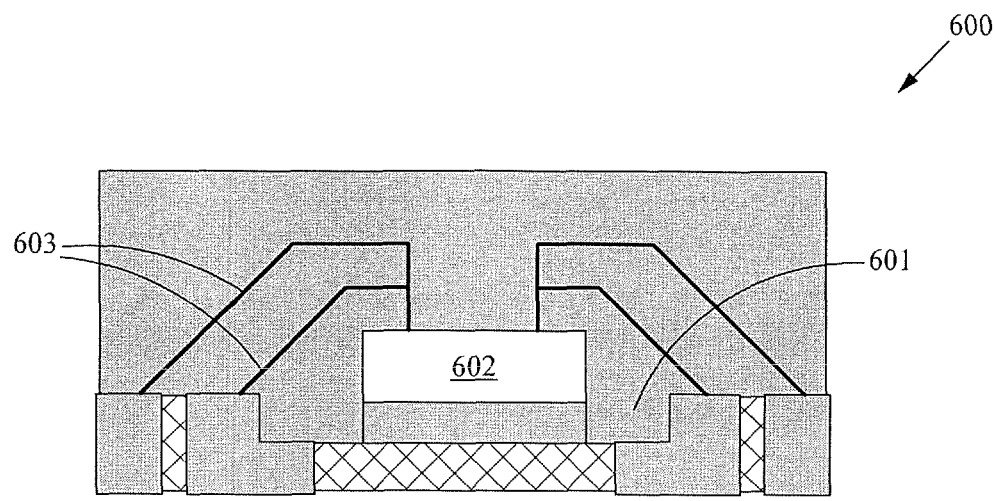
FIG. 6A is a semiconductor package per an embodiment of the current invention.
Figure 6B:
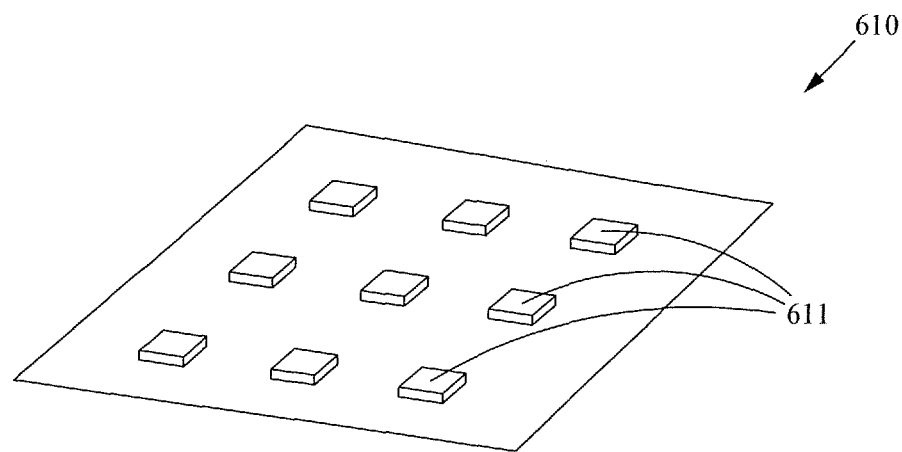
FIG. 6B is apparatus for realizing the package depicted in FIG. 6A.
Figure 6C:
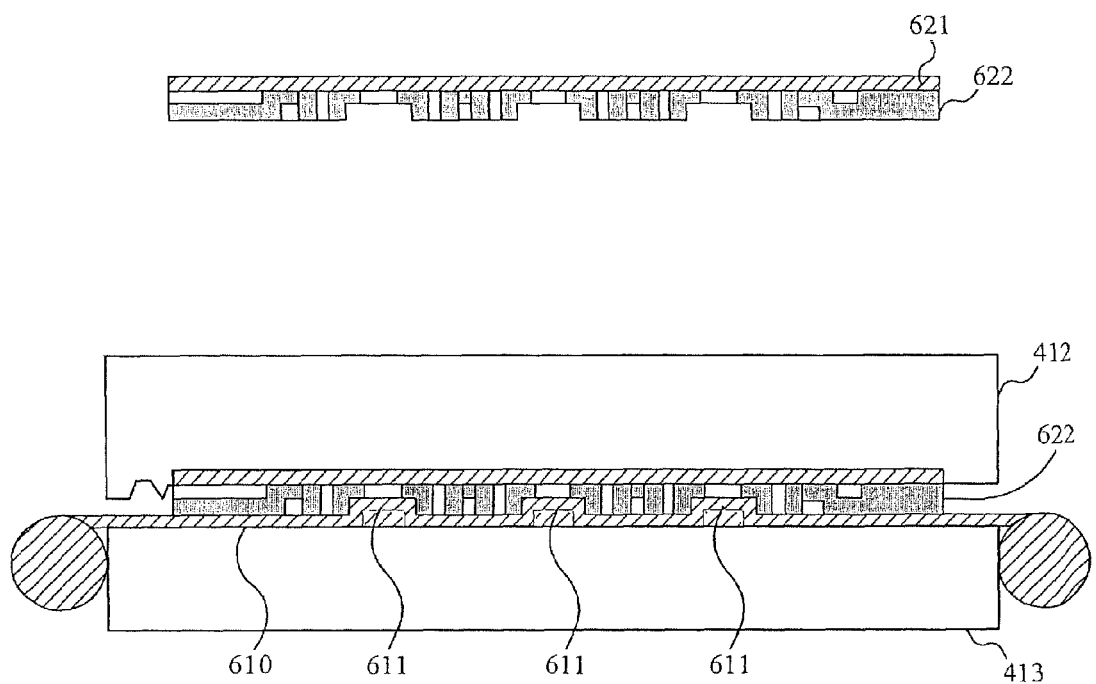
FIG. 6C is an alternate process for forming a package in FIG. 6A.

In some applications, it is advantageous for greater height clearance within the semiconductor package. FIG. 6A shows a singulated semiconductor package 600 in cross section. Within the package, a step cavity 601 is capable of receiving a thicker semiconductor die 602, larger bondwires 603 or in certain embodiments multiple stacked die. FIG. 6B shows an exemplary surface 610 of the mold 412 or 413 shown in FIG. 4B. Elevated protrusions 611 are placed to coincide with a leadframe strip to emboss a recessed area 601 into the leadframe. In an exemplary embodiment, adhesive tape 621 is applied to the back surface of the leadframe strip 622 as shown in FIG. 6C. The leadframe is flipped over such that its top surface is embossed by the surface 610 of the mold 412 or 413 having the protrusions 611.

Figure 6D:
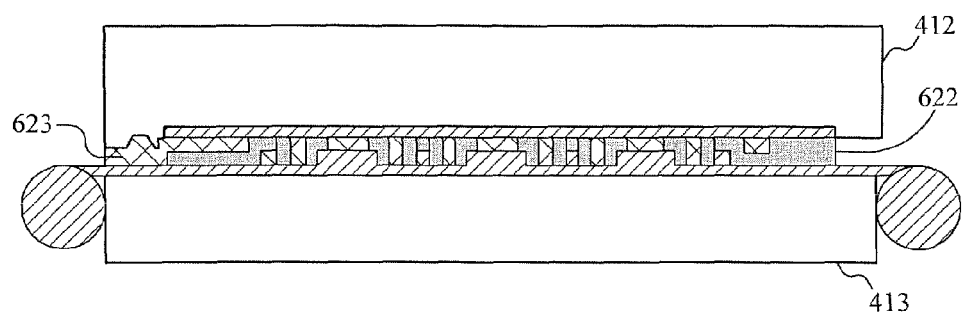
FIG. 6D is the remainder of the process for forming the package FIG. 6A.
Figure 6D:
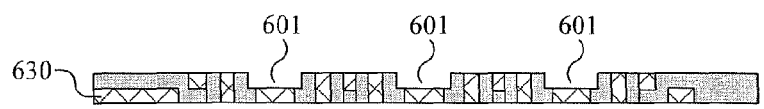
Figure 6D:
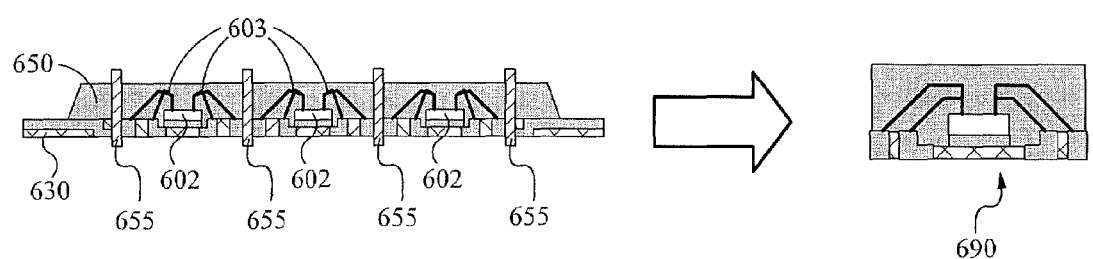
Figure 6E:
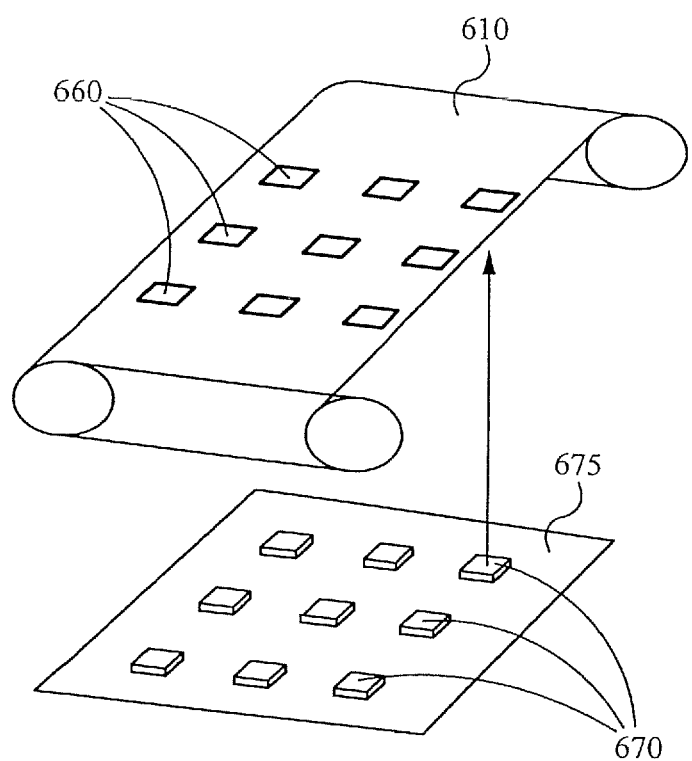
FIG. 6E is an alternate apparatus for realizing the package depicted in FIG. 6A.

FIG. 6D shows the leadframe strip 622 with a first mold compound 623 to fon a molded leadframe 630 having recessed areas 601. To form singulated packages, semiconductor devices 602 and bondwires 603 are affixed onto the molded leadframe 630. The devices 602, bondwires 603 and molded leadframe 630 are encased in a second mold compound 650. The second mold compound 650 and the first mold compound 623 are able to be the same compound or different compounds depending on the application. Saw blades 655 then singulate the molded leadframe strip 630 into individual semiconductor packages 690. As shown in FIG. 6E, in the case of thick leadframes, the non adhesive tape 610 is able to have pre-formed holes 660 configured to receive protrusions 670 on a mold surface 675. The mold surface 675 can be the surface of the top mold 412 or the bottom bold 413. The mold is able to be formed of metal, ceramic, hard impact rubber, or any other suitable material.

Figure 7:
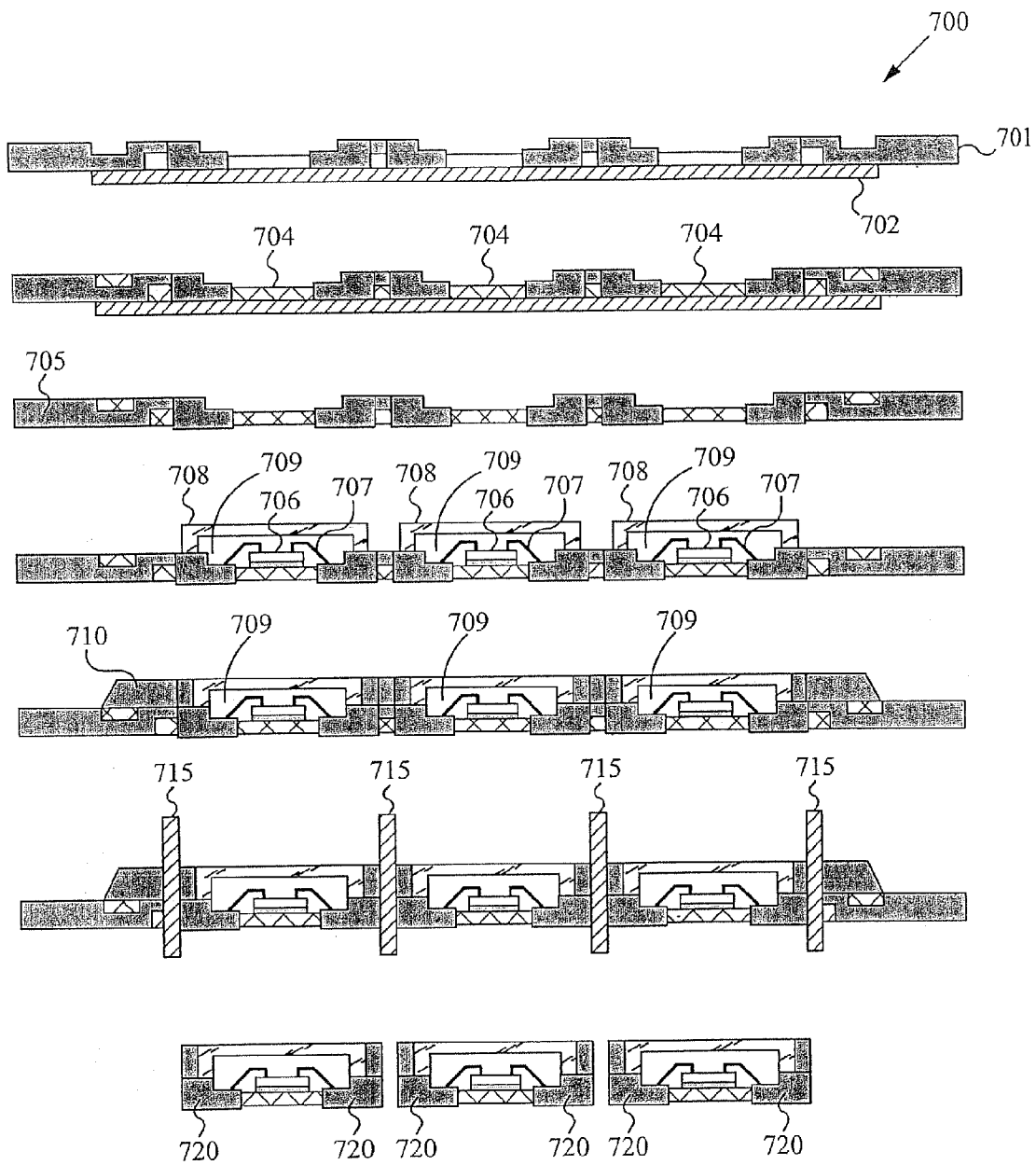
FIG. 7 is a process for forming a semiconductor package having a light penetrable opening for optical applications.
Figure 7A:
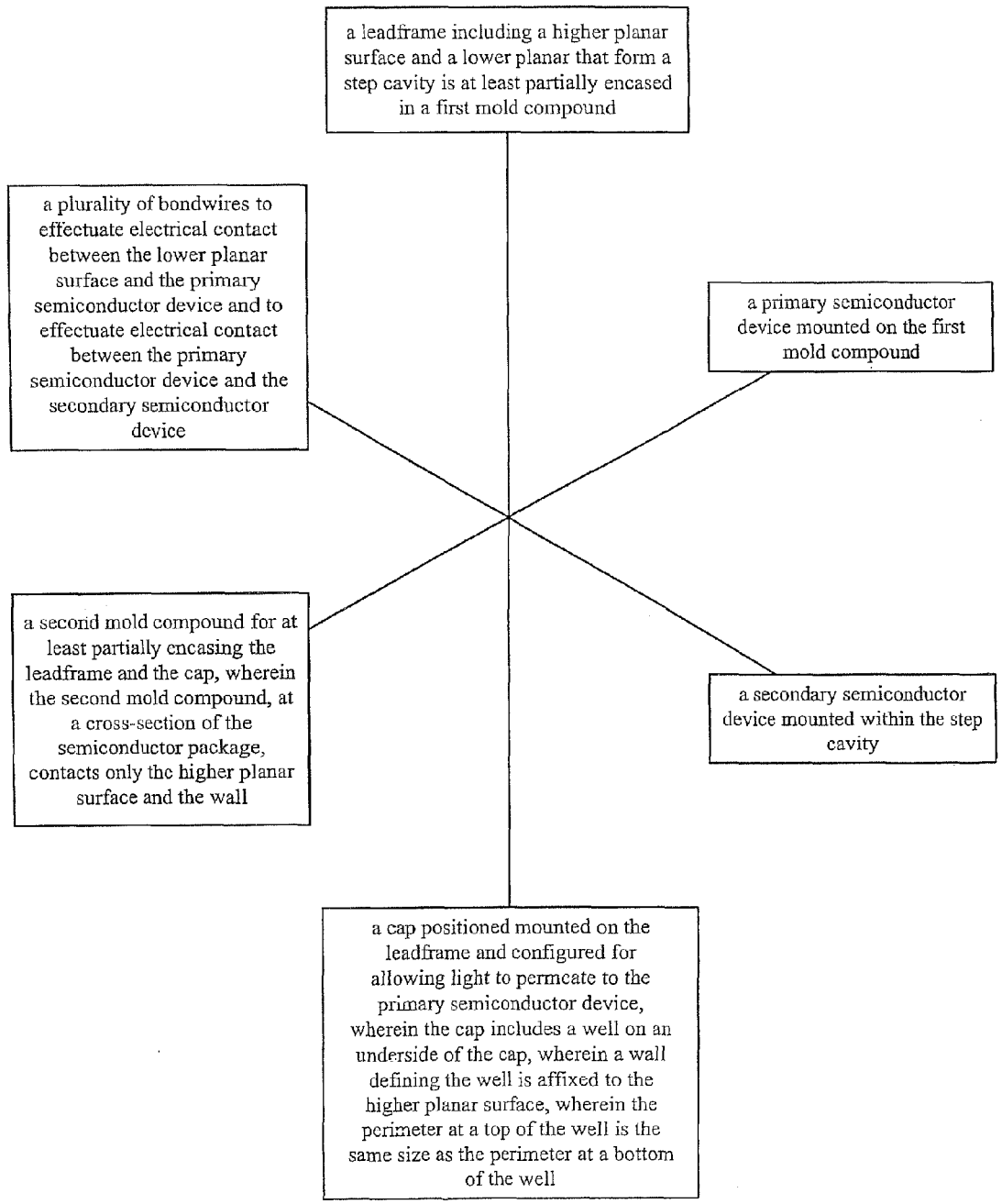
FIG. 7A is block diagram of a semiconductor package per an embodiment of the current invention.

In another aspect of the invention, a semiconductor package having a light permeable exposed surface and a process for producing the same is disclosed in FIG. 7. A leadframe strip 701 is mounted to adhesive tape 702. In some embodiments, the leadframe 701 is a half etched leadframe. The leadframe strip 701 is molded with a first mold compound 703. By way of example, the first mold compound is able to be a thermoset compound or a thermoplastic compound. In some embodiments, step cavities 704 are formed by the embossing procedure described in FIGS. 6A-6D. The adhesive tape 702 is removed forming a molded step cavity leadframe strip 705. At least one semiconductor device 706 is mounted within each cavity 704. Wirebonds 707 effectuate electrical contact between the semiconductor device and molded step cavity leadframe strip 705. In some embodiments where multiple semiconductor devices 706 are mounted in each step cavity 704, wirebonds 707 are able to effectuate electrical contact between the multiple devices 706 as applications require; FIG. 7A shows a block diagram representing of such a semiconductor package. A cap 708 is affixed to the molded cavity leadframe strip forming a full cavity 709. The cap 708 is able to be comprised of silicon, glass, metal, ceramic, or any other convenient material or combination of materials that are light permeable. A second mold compound 710 is formed over the molded step cavity leadframe strip 705, semiconductor devices 706 and wirebonds 707. Preferably, the second mold compound is applied to allow light to permeate the cap 708. The second mold compound 710 is able to be identical to or different from the first mold compound 703 as applications require. Saw blades 715 singulate the molded step cavity leadframe strip 705 into individual optical packaged devices 720. The devices 720 are then able to be marked, tested and shipped to customers. In some applications, multiple hundreds of I/O are required, and more than one leadframe is required to effectuate contact between a semiconductor device and its application. Furthermore, flexibility in routing I/O is advantageous, since end users can have specific demands as to the locations of I/O on a package landing pattern. To that end, a second leadframe (not shown) is able to be used. A second leadframe is able to couple to the first leadframe by use of a soft metal. The second leadframe is able to be used to route the I/O to any pattern required by an application, allowing great flexibility in footprints and landing patterns.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. A semiconductor package for optical applications, the semiconductor package comprising:
   a. a leadframe at least partially encased in a first mold compound, wherein the leadframe includes a first planar surface and a second planar surface that is lower than the first planar surface;
   b. at least one semiconductor device mounted on the leadframe between a first portion of the second planar surface and a second portion of the second planar surface;

c. a plurality of bondwires to effectuate electrical contact between the second planar surface and the at least one semiconductor device;

d. a cap mounted on the leadframe configured for allowing light to permeate via an exposed top of the cap to the at least one semiconductor device, wherein the cap includes a lateral surface that is perpendicular to and extends from the exposed top and is affixed to the first planar surface; and e. a second mold compound for at least partially encasing the leadframe and the cap, wherein the second mold compound, at a cross-section of the semiconductor package, contacts only the first planar surface and an exterior portion of the lateral surface.

2. The semiconductor package in claim 1, wherein the leadframe includes at least one step cavity.

3. The semiconductor package in claim 1, wherein the leadframe is coupled with another leadframe by a soft metal.

4. The semiconductor package in claim 1, wherein the soft metal is comprised of at least one of the following materials: gold, silver, lead and tin.

5. The semiconductor package in claim 1, wherein the cap is comprised of at least one of the following materials: glass, silicon, metal, ceramic or plastic.

6. A semiconductor package for optical applications, the semiconductor package comprising:

a. a leadframe including a higher planar surface and a lower planar that form a step cavity and is at least partially encased in a first mold compound;

b. a primary semiconductor device mounted on the first mold compound;

c. a plurality of bondwires to effectuate electrical contact between the lower planar surface and the primary semiconductor device;

d. a cap positioned mounted on the leadframe and configured for allowing light to permeate to the primary semiconductor device, wherein the cap includes a well on an underside of the cap, wherein a wall defining the well is affixed to the higher planar surface, wherein the perimeter at a top of the well is the same size as the perimeter at a bottom of the well; and e. a second mold compound for at least partially encasing the leadframe and the cap, wherein the second mold compound, at a cross-section of the semiconductor package, contacts only the higher planar surface and the wall.

7. The semiconductor package in claim 6, further comprising a secondary semiconductor device mounted within the step cavity.

8. The semiconductor package in claim 7, wherein the plurality of bondwires is also to effectuate electrical contact between the primary semiconductor device and the secondary semiconductor device.

9. The semiconductor package in claim 6, wherein the leadframe is coupled with another leadframe by a soft metal.

10. The semiconductor package in claim 9, wherein the soft metal is comprised of at least one of the following materials: gold, silver, lead and tin.

11. The semiconductor package in claim 6, wherein the first mold compound is different from the second mold compound.

12. The semiconductor package in claim 6, wherein the first mold compound is identical to the second mold compound.

13. A semiconductor package for optical applications, the semiconductor package comprising:

a. a leadframe including a top planar surface and a bottom planar surface, and a first mold compound filling a cavity that is defined by a first portion of the bottom planar surface and a second portion of the bottom planar surface;

b. at least one semiconductor device mounted on the leadframe;

c. a plurality of bondwires to effectuate electrical contact between the bottom planar surface and the at least one semiconductor device;

d. a cap including a lateral surface, wherein the lateral surface is affixed to and extends from the top planar surface of the leadframe, wherein the perimeter of a top side of the cap is the same size as the perimeter at a bottom side of the cap; and e. a second mold compound for at least partially encasing the top planar surface of the leadframe and the cap, wherein the second mold compound, at a cross-section of the semiconductor package, contacts only the top planar surface and the lateral surface.

14. The semiconductor package in claim 13, wherein the at least one semiconductor device includes a first semiconductor device electrically coupled with a second semiconductor device.

15. The semiconductor package in claim 13, wherein the cap forms a full cavity.

16. The semiconductor package in claim 13, wherein the cap is U-shaped.

17. The semiconductor package in claim 13, wherein sides of the cap abut the second mold compound.

18. The semiconductor package in claim 6, wherein the second mold compound and the wall affixed to the first planar surface cover the entirety first planar surface.

* * * * *